United States Patent [19]

Baliga et al.

[11] Patent Number: 4,801,985
[45] Date of Patent: Jan. 31, 1989

[54] MONOLITHICALLY INTEGRATED SEMICONDUCTOR DEVICE AND PROCESS FOR FABRICATION

[75] Inventors: Bantval J. Baliga; Deva N. Pattanayak, both of Schenectady, N.Y.

[73] Assignee: General Electric Company, Schenectady, N.Y.

[21] Appl. No.: 51,359

[22] Filed: May 19, 1987

[51] Int. Cl.$^4$ .............................................. H01L 29/78
[52] U.S. Cl. .................................. 357/23.3; 357/23.4; 357/38; 357/55; 357/86
[58] Field of Search .................... 357/23.4, 23.1, 23.3, 357/55, 38, 86

[56] References Cited

U.S. PATENT DOCUMENTS 4,503,598  3/1985  Vora et al. ...................... 357/23.4

Primary Examiner—Joseph E. Clawson, Jr.
Attorney, Agent, or Firm—Robert Ochis; James C. Davis, Jr.; Marvin Snyder

[57] ABSTRACT

The present invention relates generally to monolithically integrated gate semiconductor devices and more particularly, to improved semiconductor structures in which the parasitic four layer structure has been modified to avoid the possibility that non-preferred turn-on can occur. The length of the emitter region is reduced to thereby reduce the length of the base emitter junction and the magnitude of the IR voltage drop than can occur along that junction. Further, high density shorts are provided along that junction to prevent the parasitic four layer structure from functioning in a non-preferred latched or regenerative conducting mode. In an alternate embodiment, the parasitic four layer structure has been eliminated. Accordingly, insulated gate control of the device is preserved.

4 Claims, 12 Drawing Sheets

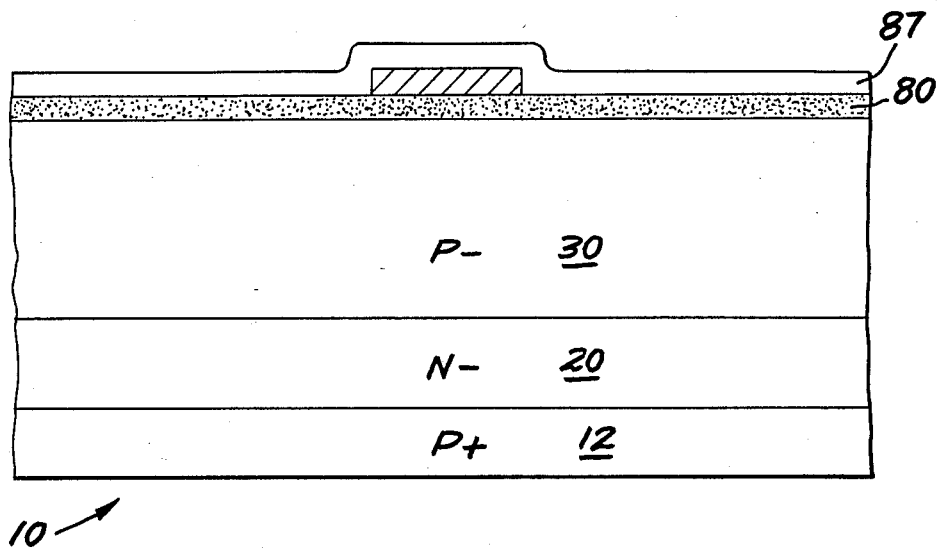
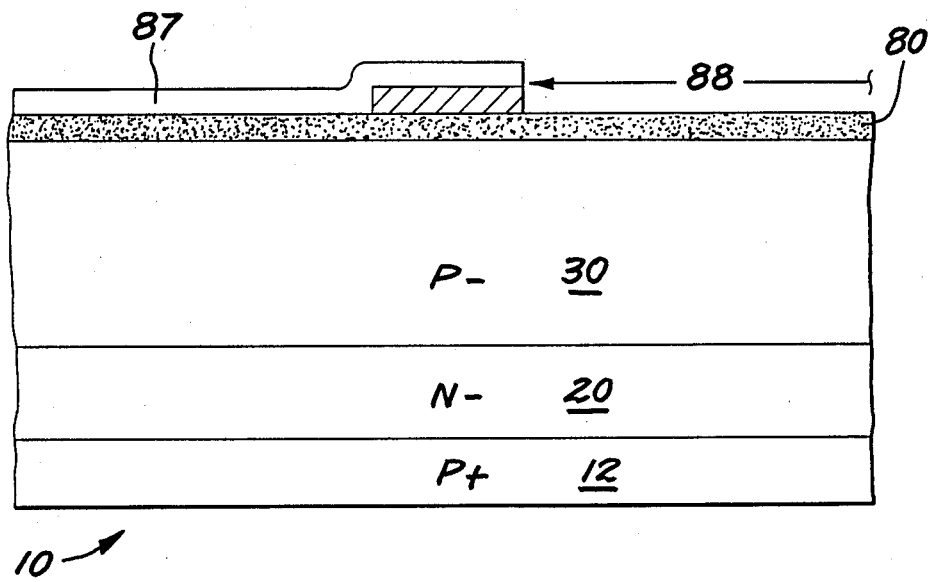

MONOLITHICALLY INTEGRATED SEMICONDUCTOR DEVICE AND PROCESS FOR FABRICATION

This application relates to insulated gate semiconductor devices and more particularly, to those monolithically integrated semiconductor devices which employ a first portion comprising, for instance, a regenerative active device structure to drive a second portion of the device comprising, for instance, a bipolar transistor. The disclosed device improves the peak turn-off current capability of the monolithically integrated insulated gate semiconductor device in alternate embodiments by using a high density short to reduce the length of the emitter portion of the inherent transistor to thereby increase the turn-off current. Alternatively, a metal contact forms an ohmic contact with both the inversion layer of the turn-off gate and the upper base layer.

RELATED APPLICATIONS

This application is related to U.S. patent application Ser. No. 051,424 for a "Monolithically Integrated Insulated Gate Semiconductor Device" and U.S. patent application Ser. No. 051,427 for a "Monolithically Integrated Lateral Semiconductor Device", U.S. patent application Ser. No. 051,422 "Monolithically Integrated Bidirectional Lateral Semiconductor Device With Insulated Gate Control in Both Directions" and U.S. patent application Ser. No. 051,430 for a "Monolithically Integrated Semiconductor Device Having Bidirectional Conducting Capability and Method of Fabrication" filed concurrently herewith, assigned to the assignee hereof, and is incorporated by reference herein.

BACKGROUND OF THE INVENTION

The above-identified related applications disclose monolithically integrated semiconductor devices in which a first portion of a semiconductor device such as an inherent thyristor is used to supply a base drive to a second portion of a semiconductor device such as an inherent bipolar transistor. Each of these devices however, includes a parasitic four layer structure which can potentially assume a regenerative conducting state and become latched into uncontrolled conduction. If this parasitic four layer structure is latched, insulated gate control of the device is lost and it is necessary to remove the forward bias and allow the forward current to decay or alternatively, commutate the device to turn the device off. These devices are therefore capable of being operated in a nonpreferred mode of operation wherein a device cannot be controlled by an insulated gate. There therefore exists an unfulfilled need to provide a monolithically integrated insulated gate semiconductor device exhibiting improved conductivity but which is more resistant to and preferably incapable of assuming a nonpreferred latch state of operation.

OBJECTS OF THE INVENTION

It is a principal object of the present invention to provide an improved monolithically integrated insulated gate semiconductor device in which the length of the base emitter junction of the parasitic four layer structure has been reduced to increase turn-off current and prevent undesired latching.

A further object of the present invention is to provide a monolithically integrated semiconductor device in which the inherent parasitic four layer structure has been eliminated and in which the cathode electrode directly contacts the base region of the device and is coupled to the regenerative active device structure by an inversion layer.

A still further object of the present invention is to provide a process for fabricating a semiconductor device in which a portion of the emitter region is removed and a high density short is established in ohmic contact with the remaining portion of the emitter region and the base region of the device.

Alternatively, a method of fabricating a monolithically integrated semiconductor device is provided wherein a cathode electrode is disposed in direct ohmic contact with the base region. The parasitic emitter region is eliminated to avoid those structures which can possible give rise to non-preferred parasitic regenerative conduction in the device. An insulated gate induced inversion channel is provided to couple the floating region to the cathode region.

SUMMARY OF THE INVENTION

These and other objects and features of the present invention are achieved in a monolithically integrated insulated gate semiconductor device comprising a first layer of one type conductivity having a second layer of opposite type conductivity disposed thereon. In addition, a third layer of one type conductivity is disposed atop the second layer. First and second regions of opposite type conductivity are disposed within the third layer and formed first and second PN junctions therewith. The first and second regions are separated by a portion of the third layer which is disposed therebetween. An insulated gate structure is disposed over the portion of the third layer situated between the first and second regions. A first surface of the device comprises portions of the first and second regions and a portion of the third layer. A portion of the second region and the third layer are removed by a suitable etch to provide a recess or trench within the second region and the third layer.

In one embodiment, a portion of the second region is removed by an appropriate etch. The exposed portion of the third layer is doped with a heavy concentration of one type conductivity impurities to establish a heavily doped one type conductivity ohmic contact third region. A metal electrode such as an aluminum layer is disposed in ohmic contact with the second and third regions to thereby provide a cathode metal electrode which shorts the second and third regions. In addition, an anode electrode can be applied in ohmic contact with the first layer.

The first, second and third layers and second region form a parasitic PNPN thyristor. However, inasmuch as a portion of the second region has been removed the maximum IR voltage than can occur adjacent the junction between the second region and the third layer is reduced below the turn-on threshold of that junction or below 0.7 volts. Further, the second region is shorted to the third region, or the emitter of the parasitic thyristor is shorted to its base to thus prevent the upper transistor portion of the parasitic thyristor from achieving a forward biased state of operation. Consequently, the parasitic thyristor cannot assume regenerative or latched type conduction.

An alternate preferred embodiment of the present invention includes a monolithically integrated insulated gate semiconductor device comprising a first layer of one type conductivity and a second layer of opposite type conductivity. A third layer of one type conductivity is disposed atop the second layer. In addition, a first region of opposite type conductivity is disposed within the third layer. An insulated gate structure is disposed over a portion of the third layer to form a channel within the third layer. A first portion of the channel is proximate, adjacent and contiguous with the first region. A portion of the third layer directly adjacent a second and opposite portion of the channel is removed to provide a trench within the third layer. A metallization layer is disposed in ohmic contact with the third layer and particularly the channel portion of the third layer established by the insulated gate structure.

In another embodiment, the parasitic PNPN structure otherwise found in these monolithically integrated semiconductor devices, has been eliminated by eliminating the parasitic emitter to thus overcome any possibility that device may latch into uncontrolled conduction. In this embodiment, the inherent regenerative active device four layer structure comprising the first, second, third layers and first region, is coupled to the cathode electrode through the insulated gate structure. Thus, in response to application of an appropriate bias or removal of the bias otherwise appropriate for coupling the first region to the cathode electrode, the device is turned off. This device is particularly preferred inasmuch as the turn-off gate can control a large amount of current without regard to the internal device structure. More particularly, the limited peak turn-off current is established not by the internal device structure, but rather by external factors such as the fusing point of the metal leads.

A method in accordance with the present invention includes the steps of initially providing a three layer body of semiconductor material comprising first and third layers of one type conductivity and a second layer of opposite type conductivity disposed therebetween. A three layer structure can be established by employing epitaxial growth techniques or doping techniques such as implantation and diffusion techniques. Any of the three layers can be used as a substrate layer with the alternate other two layers being established thereon by the aforedescribed techniques. Thereafter, in a first preferred embodiment a first protective layer is established atop the third layer. The first protective layer can be an oxide layer such as a silicon dioxide layer. A gate electrode layer such as a polysilicon layer is then deposited atop the oxide layer. A mask is then used in combination with photolithographic techniques to pattern the gate electrode layer. Subsequently, the underlying oxide layer is also etched. Thus first and second windows are opened through the gate electrode layer and the first protective layer to expose first and second portions of the surface of the third layer. Thereafter, the third layer is doped with opposite type conductivity impurities to establish first and second regions within the third layer. A second protective layer such as an oxide layer is then deposited on the exposed surface of the device.

Thereafter a third protective layer such as a photolithographic layer is deposited atop the oxide layer. The oxide layer is then patterned using photolithographic techniques to establish a third window through the third protective layer overlying a portion of the second region and a portion of the third layer. A suitable etch such as reactive iron etch can be employed to etch through the third protective layer, second region and third layer to establish a trench within the third layer.

The exposed portion of the third layer is then exposed to a diffusion environment comprising a heavy concentration of one type dopant impurities such as phosphorous impurities and one type conductivity impurities are introduced into the third layer to establish a one type conductivity region adjacent the surface of the third layer. Thereafter, a metallization layer is applied to the surfaces of the device.

In an alternate preferred embodiment, the method of the present invention proceeds from the same initial three layer body of semiconductor material comprising first and third layers of one type conductivity material with an opposite type conductivity second layer, disposed therebetween. Thereafter, a first protective layer is disposed on the upper surface of the first layer. A layer gate material such as polysilicon is then deposited atop the first protective layer. The gate layer is then patterned using photolithographic techniques and a first window is opened through the gate first protective layer to expose a first portion of the upper surface of the third layer. The exposed portion of the third layer is doped with opposite type conductivity impurities to establish a first region within the third layer. Thereafter, a second protective layer such as an oxide layer is disposed on the exposed surface of the device. A photoresist layer is then applied atop the second protective layer. The photoresist layer is then patterned to a second window not overlying the first window. A suitable etch such as a buffered hydrofluoric etch is then employed to remove the underlying exposed oxide layer and expose the third layer. A suitable etch such as reactive iron etch is employed to etch and remove the exposed portion of the third layer lying to establish a trench within the third layer. Thereafter, a first metallization layer is disposed in ohmic contact with the third layer.

The present invention thus provides for an improved monolithically integrated semiconductor device which exhibits improved resistance to uncontrolled conductivity or latched type conduction. More particularly, the disclosed structure employs a down-sized emitter in combination with high density shorts to inhibit the upper junction of the parasitic four layer structure from achieving a forward biased state. In an alternative embodiment, the emitter portion of the four layer structure is eliminated to destroy the parasitic four layer structure and forward biased conductor conduction is achieved establishing an inversion layer in the channel to directly couple the inherent four layer structure to the cathode emitter.

BRIEF DESCRIPTION OF THE DRAWINGS

The features of the present invention which are believed to be novel are specified with particularity in the appended claims. The invention itself, however, both as to organization and method of operation together with additional features, objects and advantages of the monolithically integrated insulated gate semiconductor device and the method of fabrication can be best understood by reference to the following detailed description when considered in conjunction with the accompanying drawings in which:

FIGS. 4A-4L are cross-sectional illustration of a portion of a monolithically integrated insulated gate semiconductor device during successive stages in a process of fabricating of an alternate preferred semiconductor device.

DETAILED DESCRIPTION OF THE PREFERRED EMBODIMENTS

Figure 1:
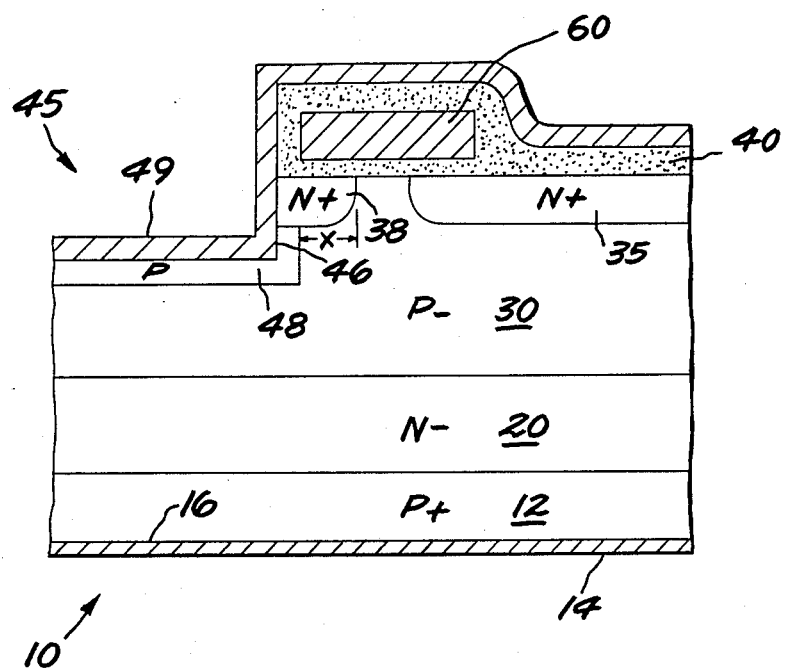
FIG. 1 is a cross-sectional illustration of a first embodiment of a monolithically integrated insulated gate semiconductor device in accordance with the present invention.

A monolithically integrated insulated gate semiconductor device of the present invention is applicable to a broad range of semiconductor devices and can be fabricated from a variety of different semiconductor materials. The ensuing description will disclose several preferred embodiments of the monolithically integrated semiconductor device of the present invention as implemented in a silicon substrate because silicon device or devices fabricated in silicon substrates make up an overwhelming majority of the currently available semiconductor devices. Consequently the most commonly encountered application of the present invention will involve silicon substrate devices. Nevertheless, it is intended that the invention disclosed herein can be advantageously employed in germanium, gallium arsenide and other semiconductor materials. Accordingly, application of the present invention is not intended to be limited to devices fabricated in silicon semiconductor materials but will encompass those devices fabricated in any of a number of semiconductor materials.

Moreover, while the present description discusses a number of preferred embodiments directed to silicon semiconductor devices, it is intended that these disclosures be considered as illustrated examples of the preferred embodiments of the present invention and not as a limitation on the scope or applicability of the present invention. Further, while the illustrated examples concern the improved conductivity monolithically integrated insulated gate semiconductor device in connection with the illustrated insulated gate controlled structures, it is not intended that the monolithically integrated features of the present invention be limited to the disclosed structures. Instead these devices are included to demonstrate the utility and application of the present invention to what are considered preferred commercial embodiments. Specifically, the present invention is additionally readily applicable to other monolithically integrated structures which employ regenerative conductive action. Further, while the present invention provides for increased current conductivity and current density, is recognized that the attendant benefit of reduced cell size and reduce cell repeat distance will also result from the improved cell structures.

Given the corresponding relationship of FIGS. 1-4, corresponding parts have been designated with the same reference as an aid to understanding the description of the invention. Various parts of the semiconductor elements, however, have not been drawn to scale. Certain dimensions have been exaggerated in relation to other dimensions in order to present a clear illustration and understanding of the present invention. Although for the purposes of illustration, the preferred embodiments of the improved conductivity monolithically integrated semiconductor device of the present invention are shown in each particular embodiment to include specific P and N type regions, it is understood that the techniques disclosed herein are equally applicable to monolithically integrated semiconductor devices in which the conductivities in the various regions have been reversed to, for instance, provide for the dual of the illustrated device.

Further although the embodiments illustrated herein are shown in two-dimensional views with various regions having depth and width, it is understood that these regions are illustrations of only a portion of a single cell of a device which is comprised of a plurality of cells arranged in a three dimensional structure. Accordingly, these regions when fabricated in actual devices will have three dimensions including length, width and depth.

Referring now to FIG. 1, a preferred embodiment of the present invention as applied to a monolithically integrated insulated gate semiconductor device generally designated 10 is shown. More particularly, a portion of a single cell of the thyristor driven transistor 10 which is symmetric about a vertical axis through the right hand portion of the illustration is shown. Monolithically integrated insulated gate semiconductor device 10 in accordance with the present invention includes a first layer 12 of one type conductivity which is shown as a p-type conductivity layer. The first layer 12 can be heavily doped to facilitate high minority carrier injection into a second layer 20 and to facilitate the formation of an ohmic contact with a first electrode 14 which can also be disposed on a first surface 16 of the first layer 12. A second layer 20 of opposite type conductivity can be disposed atop the first layer 12. The second layer 20 is illustrated as a lightly doped N type conductivity layer. A third layer 30 of one type conductivity material is disposed atop the second layer 20. In the illustrated embodiment the third layer 30 comprises p-type conductivity semiconductor material. Either the first, second or third layers 12, 20 or 30, respectively, can be used as the substrate layer and the remaining layers can be disposed thereon by epitaxial growth or doping techniques such as implantation and diffusion techniques.

Discrete first and second regions 35 and 38 are disposed in opposed relation within the third layer 30 and together with the third layer 30 form a portion of a first surface 40 of the device. A trench or groove 45 is established through a portion the second region 38 and a portion of the third layer 30 to expose an L-shaped surface region 46 which is heavily doped with one type conductivity impurities to form an L-shaped surface third region 48 comprising one type conductivity material. A cathode electrode 49 is disposed in ohmic contact with the third region 48 and the second region 38. The cathode electrode 49 thereby shorts the second region 38 to the third region 48 preventing the junction between the second and third regions 38 and 48, respectively, from becoming forward biased to inhibit the upper transistor formed between second region 38, third layer 30 and second layer 20 from becoming active, thus preventing the occurrence of regenerative conduction.

In addition, inasmuch as a portion of the second region 38 has been removed, the length of the junction between the second region 38 and the third layer 30 is reduced to thus reduce the maximum level of IR voltage drop which can be established adjacent this junction. Specifically, it is preferred that the second layer 30 have a sheet resistance of about 1,000 ohms per square centimeter and that the length "X" of the second region 38 be 3 microns or less to ensure that the maximum IR voltage drop developed along this junction be less than one half the band gap of the semiconductor material or in the case of a silicon material, to be less than approximately 0.7 volts.

An insulated gate structure 60 is disposed atop the third layer 30 overlying a portion of the third layer 30 intervening between the first and second regions 35 and 38, respectively. In response to an appropriate bias potential, the insulated gate structure 60 establishes a channel coupling the first and second regions 35 and 38, respectively. When the insulated gate structure 60 is appropriately biased, an inherent four layer structure comprising the first layer 12, the second layer 20, the third layer 30 and the first region 35 is coupled to the cathode electrode 49 through the channel and the second region 38 to thereby permit the four layer structure to assume a forward biased condition. The inherent four layer structure, when forward biased, provides regenerative conduction and supplies a base drive current to the base of the inherent bipolar transistor comprising a first layer 12, a second layer 20 and a portion of third layer 30 including the third region 48. The supplied base drive is sufficient to turn the inherent bipolar transistor fully on and thus improve the current conductivity within the device.

As used herein, the term "inherent" is used to describe a device in which one or more terminals, which are normally directly connected to an external electrode, are not directly connected to an external electrode. In the example of the inherent four layer structure, the emitter or first region 35 is coupled to the cathode electrode 49 through the insulated gate 60. Alternatively, the base of the wide bipolar transistor is not directly connected to an external terminal. The base of the transistor obtains its base drive current supply through the second layer 20 as a result of the conductivity modulation which from the inherent regenerative conduction occurring in the inherent four layer structure.

Parasitic structures are distinct from inherent structures. A parasitic structure is a device structure which can assume a conductive state. In the present device, parasitic structures are specially formed, treated or prepared to ensure that the parasitic structure does not achieve a forward biased condition under normal operating conditions.

Figure 2:
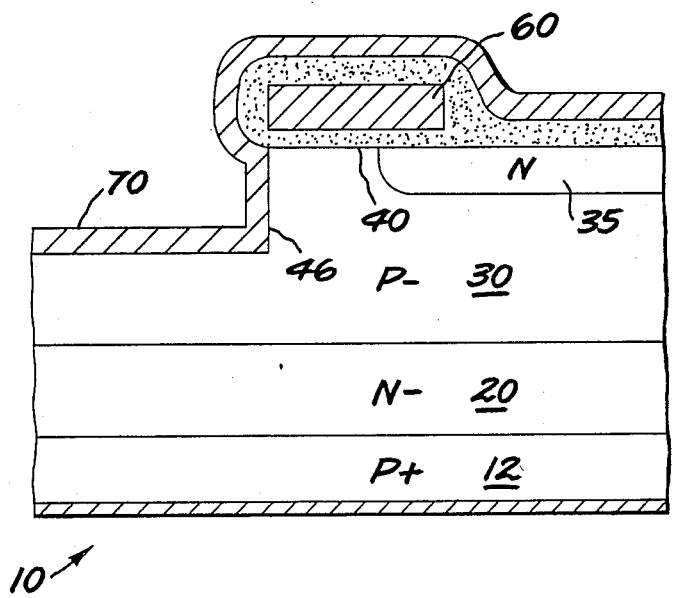
FIG. 2 is a cross-sectional illustration of an alternate preferred embodiment of a monolithically integrated insulated gate semiconductor device in accordance with the present invention.

Referring now to FIG. 2, another preferred embodiment of the monolithically integrated insulated gate semiconductor device 10 in accordance with the present invention is shown to include a body of semiconductor material having first, second and third layers 12, 20 and 30, respectively. A first region 35 of opposite type conductivity is disposed within the third layer 30 and forms a PN junction therewith. An insulated gate structure 60 is disposed atop the third layer 30 and is contiguous with the first region 35. In a preferred embodiment, the insulated gate structure 60 overlaps the first region 35. In addition, a groove 46 is disposed within the third layer 30 proximate the channel defined beneath the insulated gate structure 60. The groove 46 has a substantially L-shaped configuration and provides a first sidewall directly adjacent a portion of a channel and a second sidewall offset from and substantially parallel to the upper surface 40 of the device 10. A metallization layer 70 is applied in ohmic contact with the L-shaped surface 46 and the third layer 30. In response to an appropriate bias potential, the insulated gate structure 60 couples the first region 35 to the cathode electrode 70 to facilitate regenerative conduction in the inherent four layer structure comprising the first layer 12, second layer 20, the third layer 30 and the first region 35. In response to removal of the bias from the insulated gate structure 60, the first region 35 is decoupled from the cathode electrode 70 and regenerative conduction within the four layer structure ceases. Conduction within the four layer structure establishes a current flow which is sufficient to forward bias the inherent bipolar transistor comprising the first layer 12, the second layer 20 and the third layer 30. More particularly, the current flow provided by the regenerative conduction of the inherent four layer structure conductively modulates the base of the inherent bipolar transistor. In this embodiment the possibility that a parasitic four layer structure might achieve undesired regenerative conduction is avoided by the elimination of the emitter region. Thus, no four layer parasitic structures are in direct contact with the cathode electrode 70.

Figure 3A:
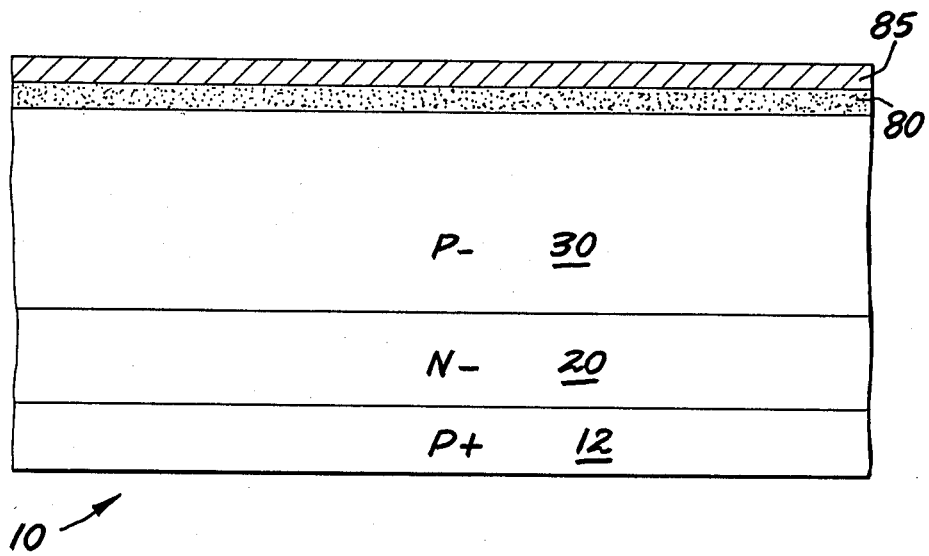
FIGS. 3A-3J are illustrations of a cross-section of a monolithically integrated semiconductor device in accordance with the present invention during successive stages in the process of fabricating that device.
Figure 3B:
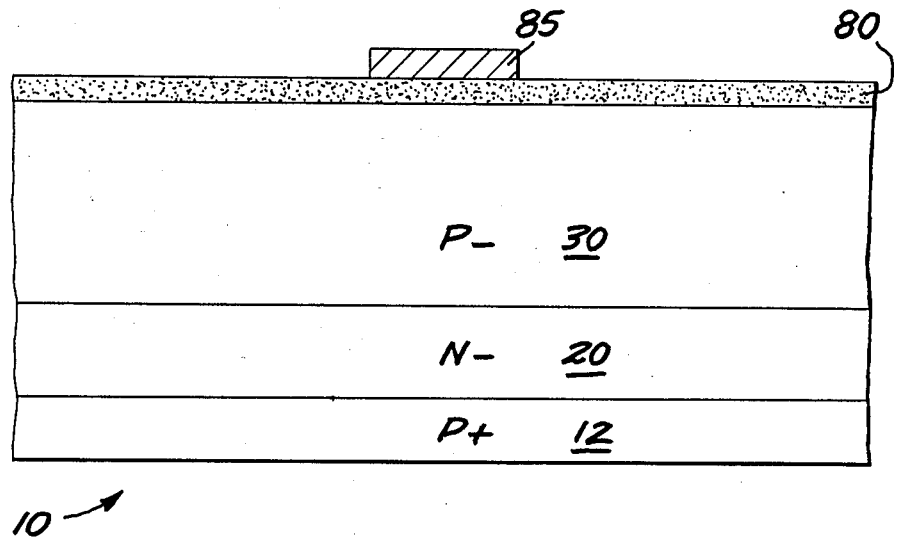
Figure 3C:
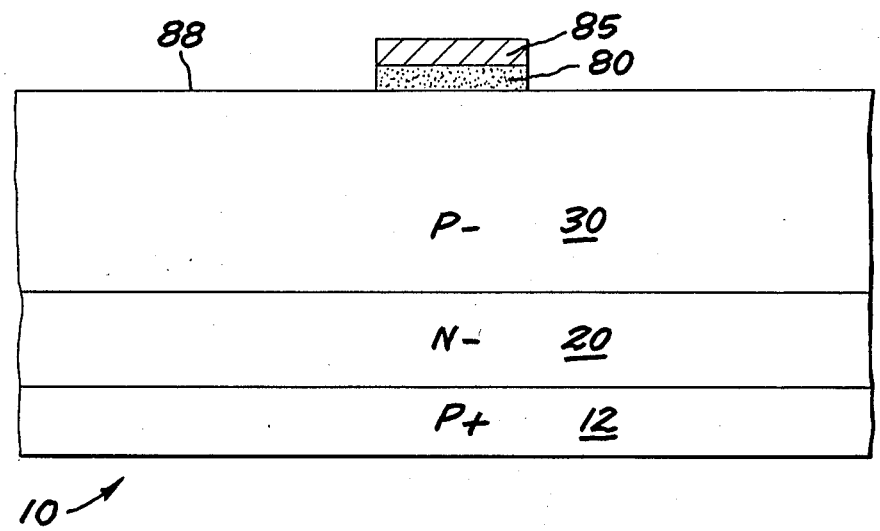

Referring now to FIGS. 3A-3N, a method of fabricating the monolithically integrated insulated gate semiconductor device 10 in accordance with the present invention is shown to comprise the following steps. Initially, a three layer structure comprising first and third layers 12 and 30, respectively, of one type conductivity with an opposite type conductivity second layer 20 disposed therebetween is provided. Any of the three layers can be a substrate layer with the other layers being disposed thereon by an epitaxial growth technique or doping techniques such as implantation or diffusion techniques. A first protective layer 80 such as an oxide layer is disposed atop the third layer 30. A gate layer 85 such as a polysilicon layer is deposited atop the first protective layer 80. Photolithographic techniques in combination with a mask (not shown) are used to pattern the gate layer 85. Thereafter, the underlying oxide layer 80 can be removed to expose first and second portions 86 and 88, respectively, of the third layer 30 as shown in FIG. 3C.

Figure 3D:
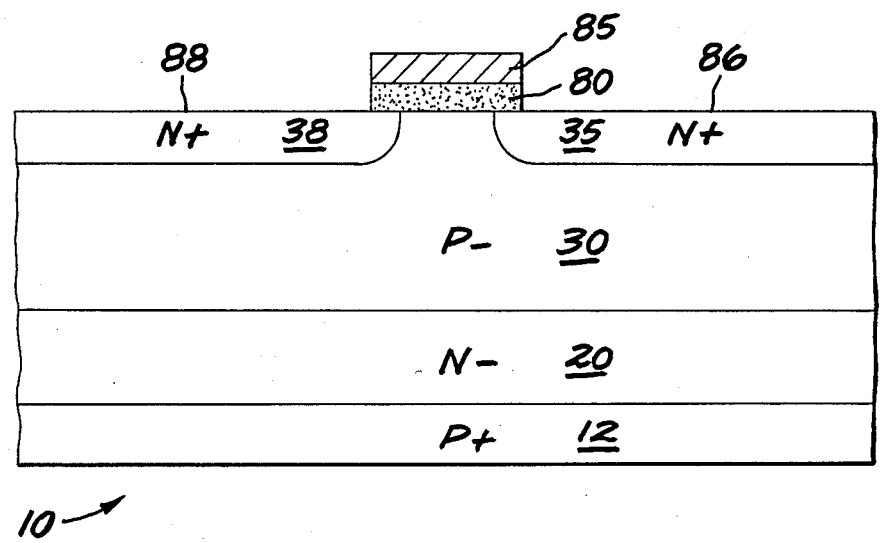

As shown in FIG. 3D, first and second regions 35 and 38 of opposite type conductivity are established through the first and second surface portions 86 and 88, respectively, by performing a first doping with a heavy concentration of opposite type conductivity impurities.

Figure 3E:
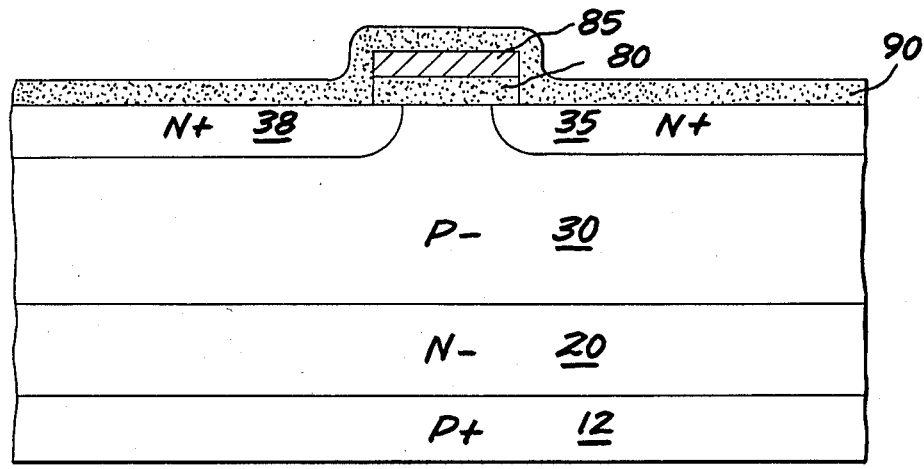

Thereafter, as shown in FIG. 3E, a second protective layer 90 is deposited on the exposed surface of the device 10.

Figure 3F:
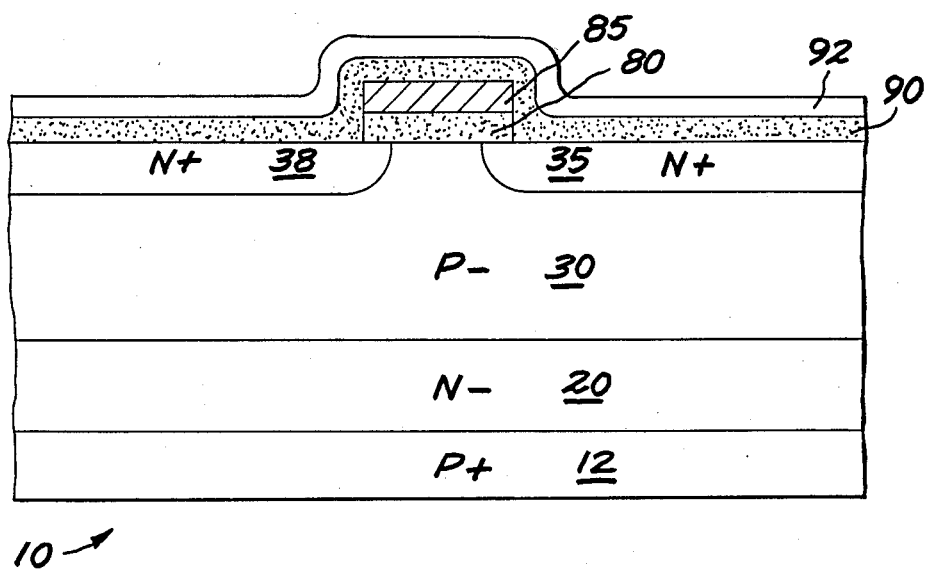
Figure 3G:
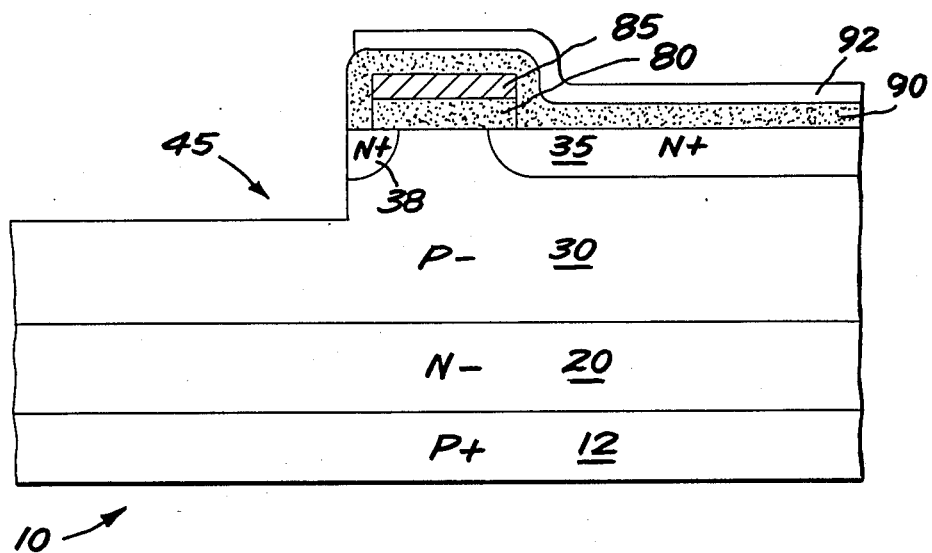

Subsequently, as shown in FIG. 3F, a photoresist layer 92 is disposed atop the second protective layer 90. As shown in FIG. 3G, the photoresist layer is patterned and the excess photoresist is removed. Thereafter, as shown in FIG. 3G, an appropriate etch is employed to remove a portion of the underlying oxide layer 90 as well as a portion of the second region 38 and third region 30 to establish a trench 45.

Figure 3H:
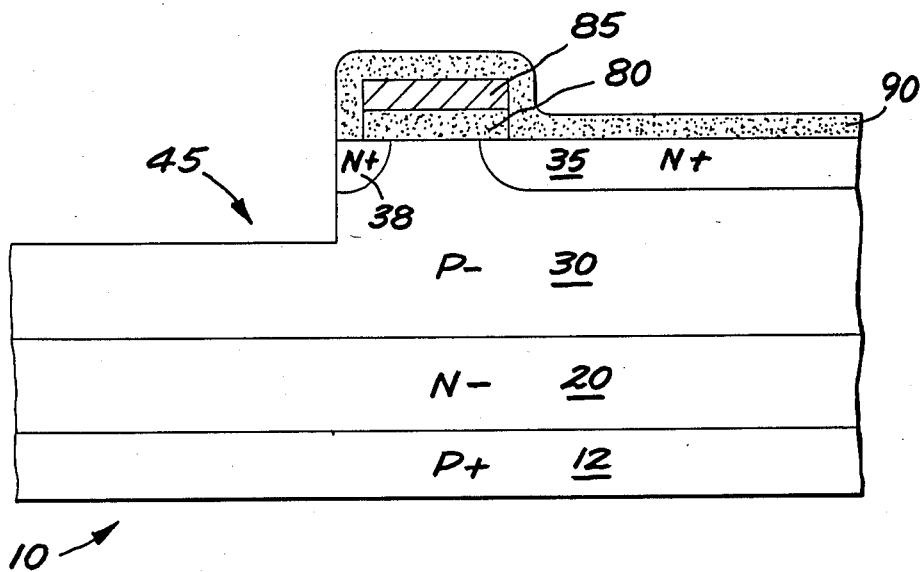
Figure 3I:
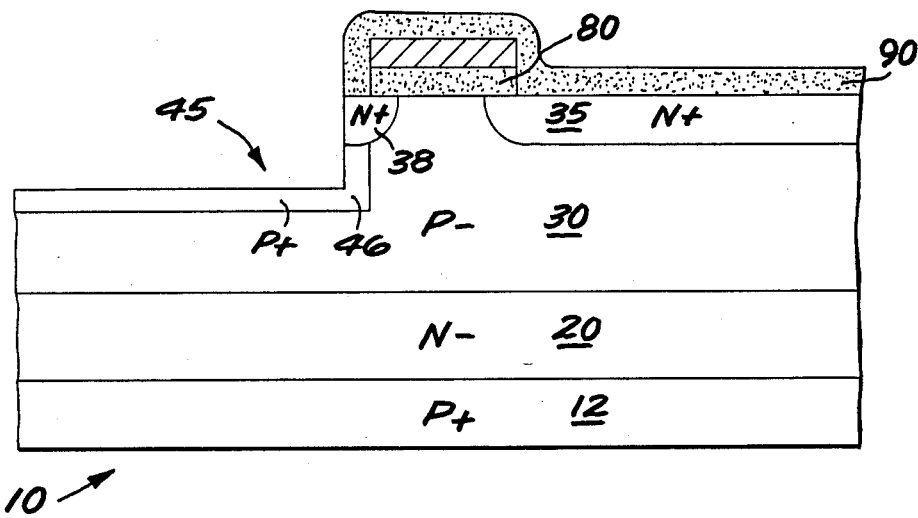
Figure 3J:
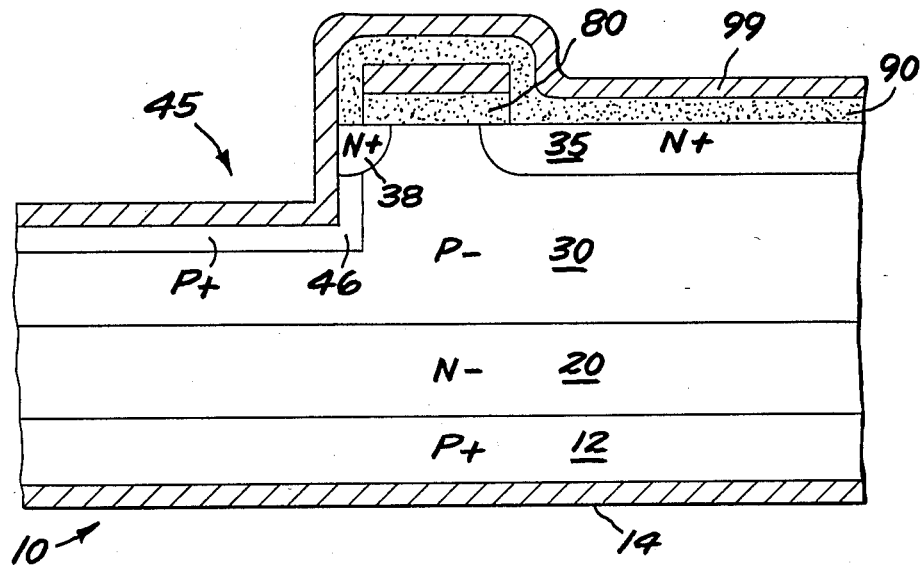

As shown in FIG. 3H, the photoresist layer 92 is removed. Thereafter, as shown in FIG. 3I, the exposed surface of the device 10 is exposed to a heavy concentration of one type impurities to establish a third L-shaped region 46 in the surface of the trench 45. Thereafter as shown in FIG. 3J, a metallization layer 99 is disposed on the exposed surfaces of the device 10 and forms an ohmic contact with the second region 38 and the third region 46. Subsequently, a first electrode 14 can be disposed in ohmic contact with the first layer 12.

In the aforedescribed method of fabrication, a monolithically integrated insulated gate semiconductor device of the present invention has been provided wherein the length of the base emitter junction of the parasitic structure has been reduced and a high density short comprising a cathode electrode 99 is disposed in ohmic contact with the third and second regions 38 and 46, respectively to prevent the forward biasing of the upper transistor portion of the parasitic four layer structure comprising the first, second, and third layers 12, 20 and 30 and second region 3 from assuming a regenerative conducting state. The cathode electrode 99 thus acts as a high density short and facilitates the operation of an insulated gate controlled device at a high current level.

Figure 4A:
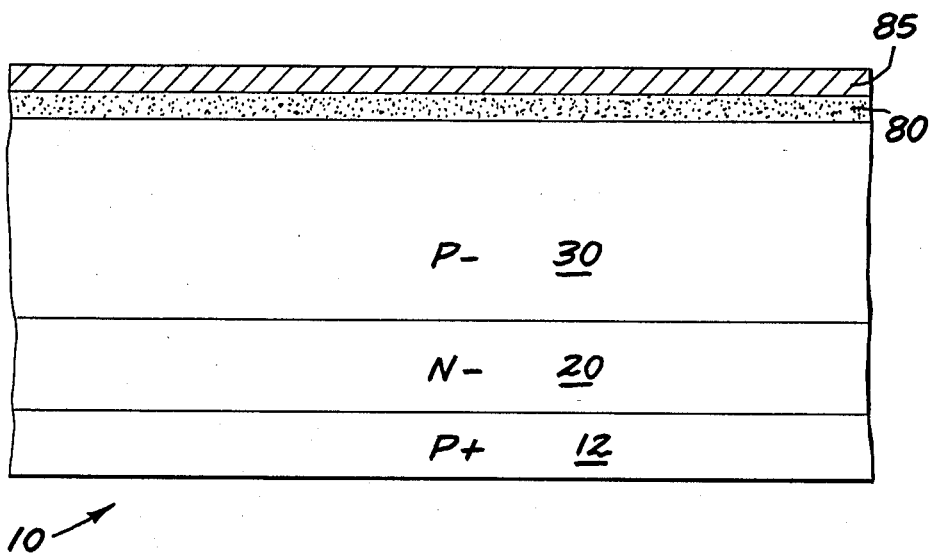
Figure 4B:
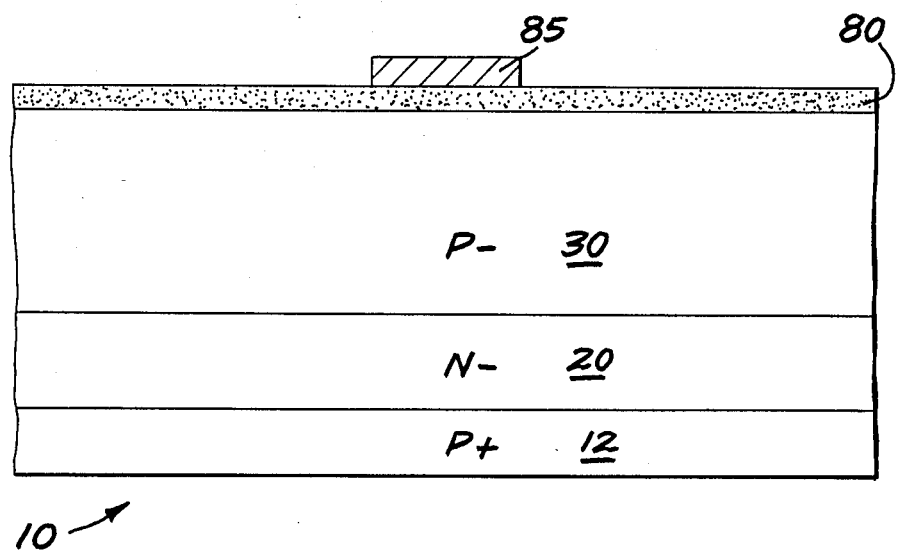

Referring now to FIG. 4A–4I, an alternate preferred embodiment of the method of fabricating a monolithically integrated insulated gate semiconductor device in accordance with the present invention is shown to include the following steps. Initially, a three layer structure comprising first and third layers 12 and 20, respectively, of one type conductivity with a second layer 20 of opposite conductivity disposed therein is provided. Initially any of the layers can be the substrate layer with the remaining two layers being established thereon by epitaxial growth techniques or doping techniques such as implantation and diffusion techniques. A first protective layer 80 such as an oxide layer is disposed atop the third layer 30. A gate layer 85 such as a polysilicon layer, is deposited atop the first protective layer 80. As shown in FIG. 4B, photolithographic techniques can be used in combination with a mask (not shown) to pattern the gate layer 85. Thereafter, a photoresist layer 87 is deposited atop the gate layer 85 and first protective layer 80. The photoresist layer 87 is patterned to define a first window 88 shown in FIG. 4D.

Figure 4E:
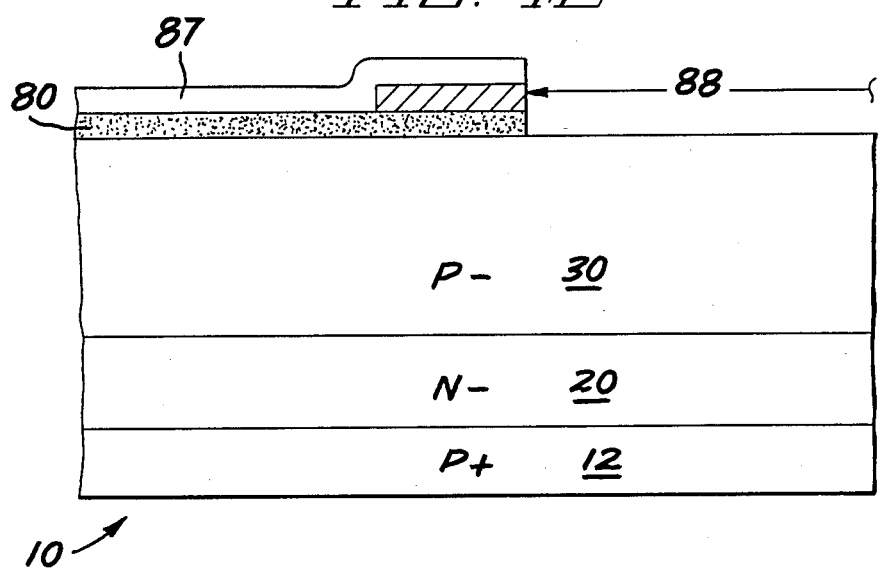
Figure 4F:
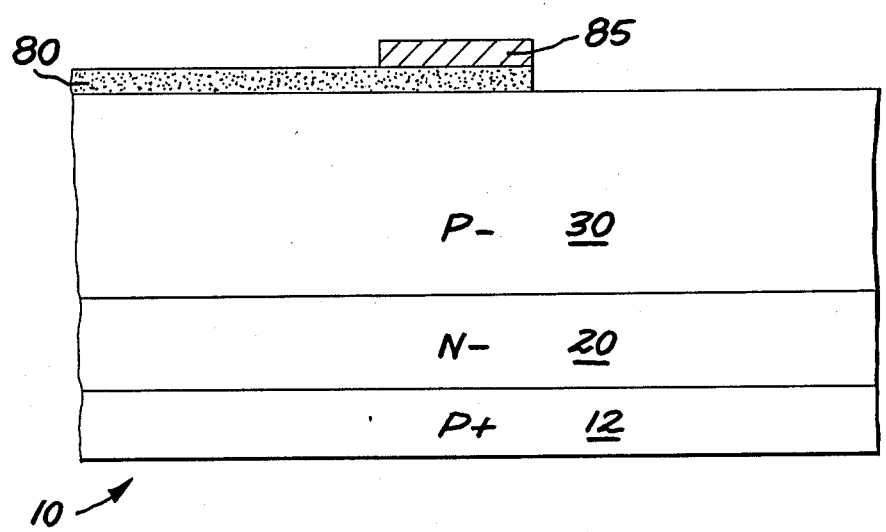
Figure 4G:
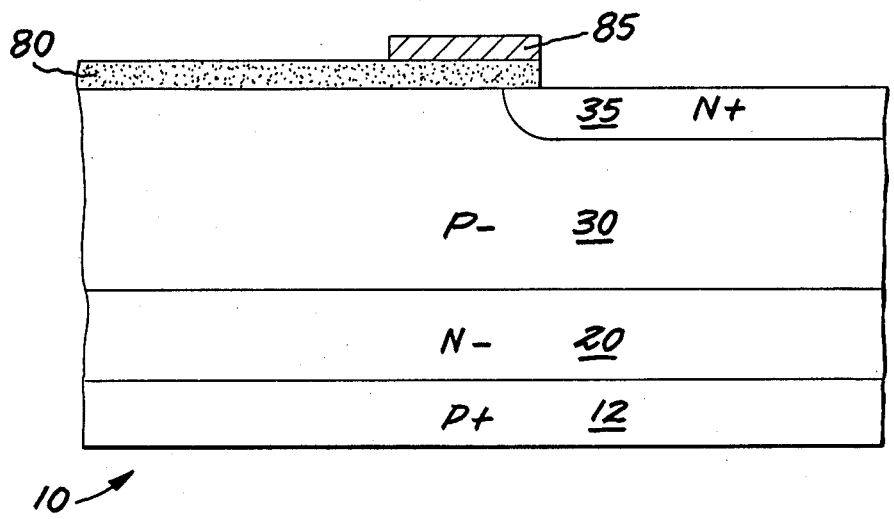

Referring now to FIG. 4E a first window 88 is also opened through a first portion of the first protective layer 80 to expose a first surface portion of the third layer 30. The remaining portion of the photoresist layer 87 is then removed as shown in FIG. 4F. Thereafter, as shown in FIG. 4G, a first region 35 of opposite type conductivity is established within the third layer 30 by exposing the surface portion of the third layer 30 to a heavy concentration of one type dopants.

Figure 4H:
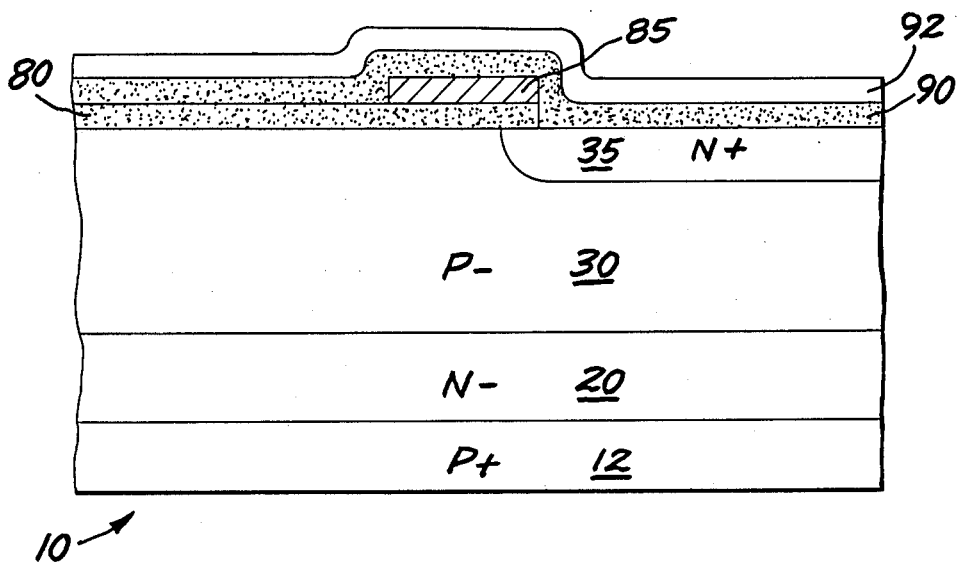
Figure 4I:
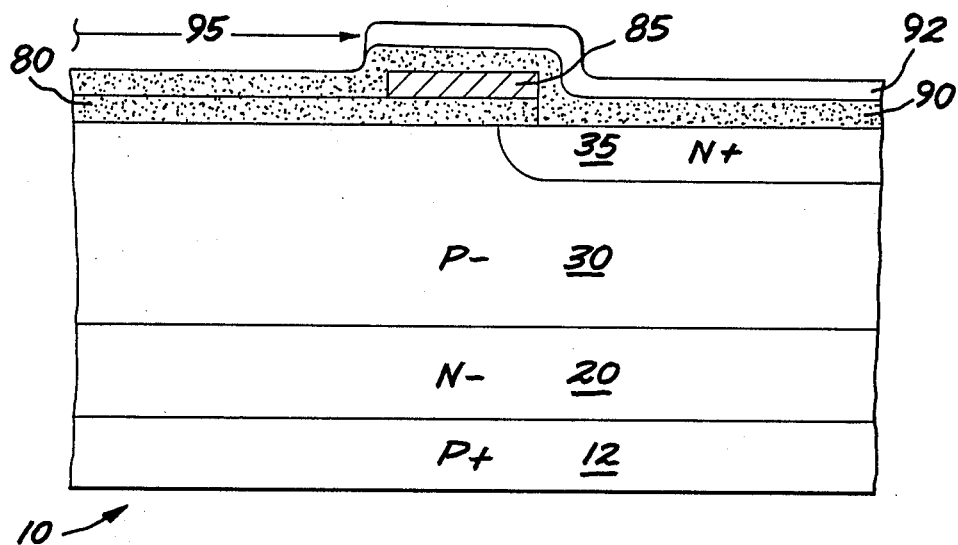
Figure 4J:
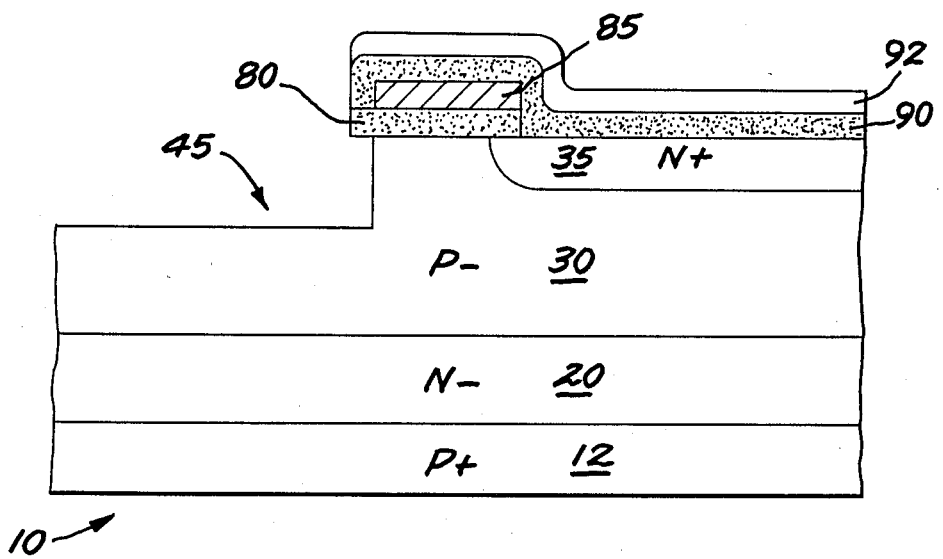

Subsequently, as shown in FIG. 4H, a second protective layer 90 is established within the first window 84. Thereafter, a photoresist layer 92 is then deposited on the layer 90 as shown in FIG. 4F. The photoresist layer 92 can be patterned to provide a second window 95 on the opposite side of the gate 85 from the first region 35 as shown in FIG. 4I. Subsequently, as shown in FIG. 4J, a reactive ion etch can be used to remove the exposed portion of the second protective layer 92, the first protective layer 80 and a portion of the third layer 30 situated therebeneath. The reactive ion etch can be used to establish an L-shaped groove or channel 45 within the third layer 30.

Figure 4K:
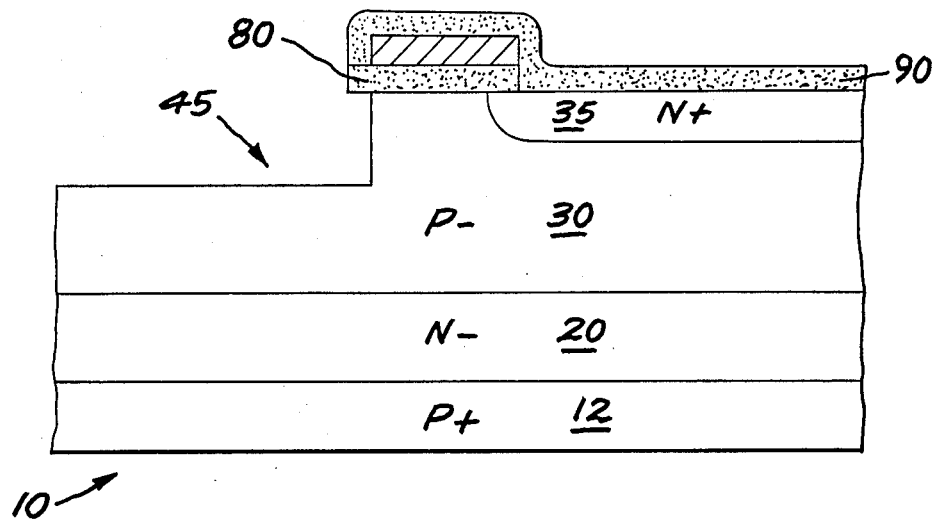
Figure 4L:
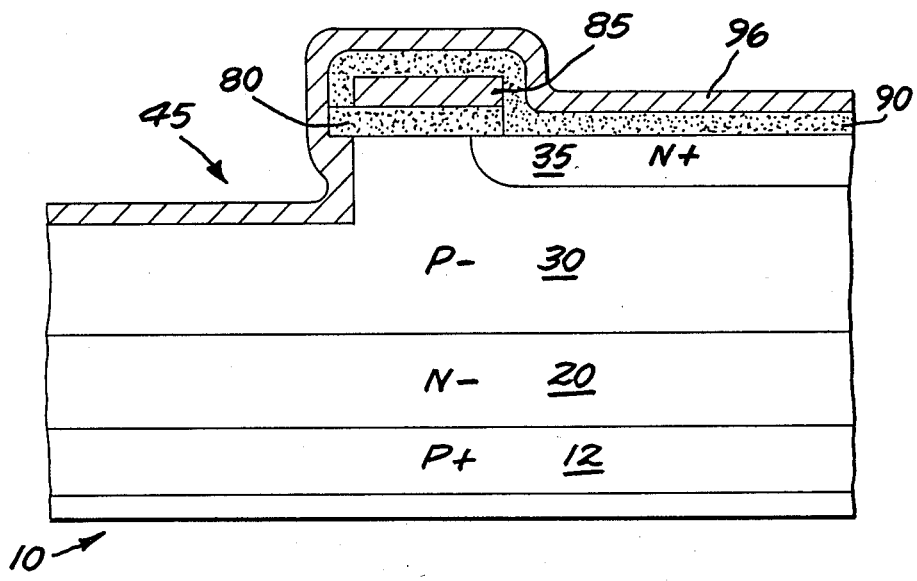

Subsequently, as shown in FIG. 4K, the photolithographic layer 92 can be removed and as shown in FIG. 4M, a metallization layer 96 can be disposed in ohmic contact with the third region 30. Subsequently, a first electrode 14 can be disposed in ohmic contact with the first layer 12.

Thus, by virtually the present invention, a monolithically integrated insulated gate electrode semiconductor device is provided wherein a first portion of the device comprising an inherent active four layer structure is provided proximate a second inherent three layer structure. The four layer structure is coupled exclusively to the cathode electrode through an insulated gate structure and thus a single gate can turn the device on and off. While the illustrated embodiment employs an inherent insulated gate thyristor, it is recognized that a variety of active devices can be employed as a source of conductivity modulation for the inherent transistor.

While the preferred embodiments have been illustrated and described, it is clear that the present invention is not so limited. Numerous modifications and changes, variations and substitutions and equivalents will occur to those skilled in the art without departing from the true spirit and scope of the present invention. Accordingly, it is intended that the present invention herein be limited only by the scope of the appended claims.

What is claimed is:

1. A monolithically integrated insulated gate semiconductor device comprising:
   a first layer of one type conductivity;
   a second layer of opposite type conductivity disposed atop the first layer;
   a third layer of one type conductivity disposed atop said second layer, said third layer having first and second parallel plane surfaces and a third surface transverse to said first and second plane surfaces;
   a first region of opposite type conductivity disposed within said third layer adjacent said first plane surface;
   a metallization layer applied in ohmic contact with said transverse surface;
   an insulated gate disposed on said third layer coupling said first region to said metallization layer;
   said insulated gate, in response to an appropriate applied potential, coupling said first region to said metallization layer and in response to removal of said bias, decoupling said first region from said metallization layer.

2. The semiconductor device of claim 1 further including a second region of opposite type conductivity disposed in said third layer and opposed relation with said first region beneath said insulated gate, said second region is disposed adjacent said first plane surface and third transverse surface and in ohmic contact with said metallization layer.

3. The insulated gate semiconductor device in claim 2 further including a heavily doped region of one type conductivity disposed in ohmic contact with said metallization layer and adjacent said second region and said third layer, said heavily doped layer being adjacent said second transverse surface and third plane surface.

4. The semiconductor device of claim 1 wherein said insulated gate structure overlaps said first and second regions.

* * * * *